(12) United States Patent
Kusumoto et al.

(10) Patent No.: US 7,772,098 B2
(45) Date of Patent: Aug. 10, 2010

(54) METHOD FOR MANUFACTURING SEMICONDUCTOR DEVICE

(75) Inventors: Osamu Kusumoto, Hyogo (JP); Chiaki Kudou, Hyogo (JP); Kunimasa Takahashi, Hyogo (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/593,141

(22) PCT Filed: Mar. 26, 2008

(86) PCT No.: PCT/JP2008/000732

§ 371 (c)(1),
(2), (4) Date: Sep. 25, 2009

(87) PCT Pub. No.: WO2008/120467

PCT Pub. Date: Oct. 9, 2008

(65) Prior Publication Data

US 2010/0093161 A1    Apr. 15, 2010

(30) Foreign Application Priority Data

Mar. 29, 2007   (JP) ............................. 2007-088342

(51) Int. Cl.
*H01L 21/425* (2006.01)
*H01L 21/265* (2006.01)
*B05C 13/00* (2006.01)
*B05C 13/02* (2006.01)
*B05C 21/00* (2006.01)

(52) U.S. Cl. ...................... 438/522; 438/526; 438/530; 257/E21.337; 257/E21.033; 118/500

(58) Field of Classification Search ................. 118/500; 438/530, 526, 522, 373, 359, 290, 228, 419, 438/528, 401, 363, 275, 714, 720, 258; 257/E21.336, 257/E21.337, E21.033, E21.375, E21.644, 257/E21.038, E21.035, E21.066, E21.654
See application file for complete search history.

(56) References Cited

U.S. PATENT DOCUMENTS 6,549,392 B1    4/2003    Ohno et al.

(Continued)

FOREIGN PATENT DOCUMENTS

JP        64-067976        3/1989

(Continued)

OTHER PUBLICATIONS

International Search Report for corresponding application No. PCT/JP2008/000732 mailed May 13, 2008.

(Continued)

*Primary Examiner*—Walter L Lindsay, Jr.
(74) *Attorney, Agent, or Firm*—Renner, Otto, Boisselle & Sklar, LLP

(57) ABSTRACT

On one face of a semiconductor wafer 1 having a first face (principal face) 1a and a second face (rear face) 1b, a protection film 2 is formed. When allowing the semiconductor wafer 1 to be attracted onto an attracting face of an electrostatic chuck 6 which is heated to 400° C. or more, the semiconductor wafer 1 is attracted onto the attracting face via the protection film 2. While heating the semiconductor wafer 1 to 400° C. or more, an ion implantation is performed for the face of the semiconductor wafer 1 on which the protection film 2 is not formed. Thereafter, the protection film 2 is removed from the semiconductor wafer 1.

10 Claims, 10 Drawing Sheets

U.S. PATENT DOCUMENTS

| | | | |
|---|---|---|---|
| 2004/0183080 A1 | 9/2004 | Kusumoto et al. | |
| 2005/0045619 A1* | 3/2005 | Kushihashi et al. | 219/444.1 |
| 2007/0045631 A1 | 3/2007 | Endo et al. | |
| 2008/0318431 A1* | 12/2008 | Ohmi et al. | 438/710 |
| 2010/0093161 A1* | 4/2010 | Kusumoto et al. | 438/522 |

FOREIGN PATENT DOCUMENTS

| | | |
|---|---|---|
| JP | 08-055900 | 2/1996 |
| JP | 2000-012664 | 1/2000 |
| JP | 2003-017223 | 1/2003 |
| JP | 2003-086816 | 3/2003 |
| JP | 2003-142467 | 5/2003 |
| JP | 2003-249544 | 9/2003 |
| JP | 2004-304174 | 10/2004 |
| JP | 2005-072066 | 3/2005 |
| JP | 2005-142496 | 6/2005 |
| JP | 2006-324585 | 11/2006 |
| JP | 2007-036289 | 2/2007 |
| WO | 2005/048341 | 5/2005 |

OTHER PUBLICATIONS

S. Imai et al., "Hot-Implantation of Phosphorus Ions into 4H-SiC", Material Science Forum, vols. 338-342 (2000), pp. 861-865 (cited in [0008], p. 5 of the description).

A. Schöner; "Ion implantation and diffusion in SiC", Process Technology for Silicon Carbide Devices, published by INSPEC, pp. 51-67 (cited in [0008], p. 5 of the description).

Written Opinion for corresponding application No. PCT/JP2008/000732 mailed Feb. 12, 2008.

* cited by examiner (a)

(b)

(c)

(d)

(e)

US 7,772,098 B2

METHOD FOR MANUFACTURING SEMICONDUCTOR DEVICE

TECHNICAL FIELD

The present invention relates to a production method for a semiconductor device which is performed by using an electrostatic chuck, and in particular to a production method for a semiconductor device which includes a step of attracting a semiconductor wafer with an electrostatic chuck that is heated to a high temperature of 400° C. or more.

BACKGROUND ART

A power device is a semiconductor element in which a large current flows, and is expected to have a high breakdown voltage and a low loss. Conventionally, power devices in which silicon (Si) semiconductor is used have been in the main stream. In recent years, however, power devices in which silicon carbide (SiC) semiconductor is used are drawing attention and are under development. A silicon carbide semiconductor has a breakdown field which is one digit higher than that of silicon, and therefore is able to maintain a reverse voltage even if the depletion layer of a PN junction or a Schottky junction is reduced in thickness. Since this makes possible a thin device thickness and a high doping concentration, silicon carbide is expected as a power device material with a low ON resistance, a high breakdown voltage, and a low loss.

FIG. 10 is a cross-sectional view showing the structure of a double implantation MOSFET, as an example of a silicon carbide semiconductor device. On a substrate 101 which is made of a silicon carbide having a low resistance, a high-resistance layer 102 having a higher resistance than that of the substrate 101 is epitaxially grown. In the surface region of the high-resistance layer 102, a p type well region 103 is formed via selective ion implantation, inside which an high-concentration n type source region 105 and a p type p$^+$ contact region 104 located in a region surrounded by the source region 105 are provided via ion implantation.

From above the high-resistance layer 102 interposed between the two well regions 103 to above the end portions of the source regions 105 within the two well regions 103, a gate insulating film 106 which is made of a thermal oxide film is formed. A gate electrode 109 is formed on the gate insulating film 106. From above the p$^+$ contact region 104 to above the end portions of the source region 105 located on both ends thereof, a source electrode 108 which is in ohmic contact with the contact region 104 is provided. Furthermore, over the entire rear face of the substrate 101, a drain electrode 107 which is in ohmic contact with the substrate 101 is provided.

An interlayer insulating film 110 is deposited on the high-resistance layer 102, the p type well regions 103, the p$^+$ contact regions 104, and the source regions 105. In the interlayer insulating film 110, contact holes which respectively reach the source electrodes 108 and the gate electrodes 109 are provided. On the interlayer insulating film 110, upper wiring 111 which is made of a thickness 2 μm of aluminum and which fills in the contact holes is provided. The above structure is disclosed in Patent Document 1, for example.

In order to reduce the contact resistance of the drain electrode 107, it is preferable to perform an ion implantation for the rear face of the substrate 101, thus forming an ion implantation layer having a high concentration of impurity on the rear face of the substrate 101 (Patent Document 2).

In the case of silicon carbide semiconductor, it is difficult to effect thermal diffusion of impurities, and therefore an ion implantation must be performed in order to form the diffusion layers such as the source regions 105, the well regions 103, and the contact regions 104. In the case of a silicon semiconductor element, formation of diffusion layers via thermal diffusion is possible, but miniaturization in the recent years has made it important to form diffusion layers via ion implantation.

However, an ion implantation for silicon carbide semiconductor has a unique problem in that the ion implantation needs to be performed at a high temperature. Silicon carbide has a high cohesive strength, and a high temperature of 1600° C. or more is needed for an activation annealing to be performed after the ion implantation. However, such an activation annealing alone will not suffice, and it is considered necessary to maintain the silicon carbide substrate at a high temperature of 400° C. or more even while the ion implantation is being performed (e.g., Patent Document 4, Non-Patent Document 1, Non-Patent Document 2). The reason is that performing an ion implantation at a high temperature makes it possible to reduce the surface roughening after the activation annealing and reduce an increase in the sheet resistance of the diffusion layers, thus enhancing the activation rate of impurities.

Conventionally, a high-temperature ion implantation is performed while supporting a silicon carbide substrate (semiconductor wafer) on a carbon susceptor having a resistance heater embedded therein, for example. A mechanical device for fixing a semiconductor wafer via screwing is attached to the carbon susceptor, and, each time upon ion implantation, an operator needs to fix the semiconductor wafer onto the carbon susceptor via screwing. Therefore, the semiconductor wafer cannot be automatically conveyed, and the vacuum in the ion implantation chamber is broken for allowing the semiconductor wafer to be fixed onto the carbon susceptor. Moreover, after fixing the semiconductor wafer onto the carbon susceptor, a vacuum evacuation and a temperature elevation in the ion implantation chamber need to be performed, and then the ion implantation must be performed. The temperature elevation is performed, in the interior of the ion implantation apparatus, by heating the semiconductor wafer fixed to the carbon susceptor with the aforementioned resistance heater internalized in the carbon susceptor, or with an externally-provided lamp annealer, and so on. After the high-temperature ion implantation is completed, the temperature of the semiconductor wafer and the carbon susceptor is lowered, and after again breaking the vacuum in the ion implantation chamber, the semiconductor wafer having experienced the implantation is taken out to the exterior. Thus, the conventional method which fixes a semiconductor wafer onto a carbon susceptor via screwing has a problem of very low throughput and poor mass producibility.

In order to solve the aforementioned problems of a high-temperature ion implantation step, ion implantation apparatuses employing a high-temperature electrostatic chuck are being studied in the recent years. Generally speaking, an electrostatic chuck is a device for fixing a wafer by using an electrostatic force, and is disclosed in Patent Document 3, for example. Hereinafter, the construction of an electrostatic chuck will be described with reference to FIG. 11. FIG. 11 is a cross-sectional view showing the schematic structure of an electrostatic chuck.

The illustrated electrostatic chuck 6 includes a base 21 which is made of an insulator, a first electrode 23a and a second electrode 23b which are embedded within the base 21, and a surface dielectric layer 22 which is deposited on the surface of the base 21. The first electrode 23a and the second electrode 23b are connected to a power supply 24 which is external to the electrostatic chuck 6. When voltages of opposite polarities are applied to the first electrode 23a and the second electrode 23b with the power supply 24, an electric charge is induced on the surface of the surface dielectric layer 22. When an attracted object such as a semiconductor wafer 1 is placed so as to closely face the surface dielectric layer 22, an electric charge of the opposite polarity from the electric charge which is induced on the surface of the surface dielectric layer 22 is induced on the opposing face of the semiconductor wafer 1, so that a Coulomb force or a Johnsen-Rahbek force acts therebetween, thus making it possible to fix the attracted object onto the electrostatic chuck 6 via attraction (chucking).

In the present specification, a region of the surface of an electrostatic chuck that comes in contact with an attracted object will be referred to as an "attracting face". This attracting face may also be referred to as a chuck face or a contact face. On the other hand, a surface of a semiconductor wafer that comes in contact with the "attracting face" of an electrostatic chuck will be referred to as an "attracted face".

In order to heat a semiconductor wafer at the time of ion implantation, a heating mechanism such as a heater (not shown) is provided on the aforementioned electrostatic chuck, and the electrostatic chuck is constantly heated to a high temperature (e.g. 400° C.) even before the semiconductor wafer is attracted. By thus attracting the semiconductor wafer with the electrostatic chuck which is heated to a high temperature, the semiconductor wafer can be heated via heat conduction, whereby a high-temperature ion implantation can be realized.

[Patent Document 1] Japanese Laid-Open Patent Publication No. 2004-304174

[Patent Document 2] Japanese Laid-Open Patent Publication No. 2003-86816

[Patent Document 3] Japanese Laid-Open Patent Publication No. 2003-249544

[Patent Document 4] Japanese Laid-Open Patent Publication No. 2006-324585

[Non-Patent Document 1] Seiji Imai et al., Material Science Forum, Vol. 5, 338-342 (2000) pp. 861 to 865

[Non-Patent Document 2] PROCESS TECHNOLOGY FOR SILICON CARBIDE DEVICES pp. 51 to 67, published by INSPEC

DISCLOSURE OF INVENTION

Problems to be Solved by the Invention

However, a problem has been found in that, when the rear face of an SiC wafer is subjected to a high-temperature ion implantation by using an electrostatic chuck having a heating mechanism, the characteristics of the finally-obtained device may be deteriorated and the production yield may be lowered, depending on the position of the SiC wafer.

According to detailed studies by the inventors, it has been found that a cause of the deterioration in device characteristics is defects, e.g., scratches, which are formed on the attracting face of an SiC wafer that is attracted onto an electrostatic chuck. Moreover, it has been found that such defects may occur not only in SiC wafers but also in other semiconductor wafers (e.g. Si wafers).

Furthermore, a problem has also been found in that, depending on the material of the surface dielectric layer used for the electrostatic chuck, a large number of particles may adhere to the semiconductor wafer, thus lowering the production yield of the semiconductor device.

FIG. 12 is a graph showing the number of defects in a mirror face (attracted face) of a wafer as measured by using a defect checking apparatus, with respect to the case where the mirror face of an Si wafer is screwed to a conventional carbon susceptor having an internal heater, and the case where it is chucked to a high-temperature electrostatic chuck. In either case, after the wafer is attracted or screwed, several hundred to several thousand defects were observed across the entire wafer. It was found that the defects were removable with cleaning in the case of a carbon susceptor, but could not be removed even with cleaning in the case of being fixed onto an electrostatic chuck. In other words, it has been found that the problem of defects is unique to the case where a high-temperature electrostatic chuck is used.

As for the cleaning, a combination of SPM cleaning (cleaning with a sulfuric peroxide mixture) and APM cleaning (cleaning with an ammonia-and-hydrogen peroxide mixture) often used for a semiconductor process was performed.

Such a problem has never occurred in the case where an electrostatic chuck is not heated to a high temperature, and is an important problem that absolutely needs to be solved for mass production of a silicon carbide semiconductor device which is to be produced by utilizing high-temperature ion implantation.

Note that Patent Document 4 points out a problem in that, when a high-temperature ion implantation is performed while mounting an SiC substrate on a susceptor, the metal which is present on the susceptor face comes in contact with the surface of the SiC substrate to cause a solid phase reaction, and that this reaction product unfavorably affects the subsequent steps. Patent Document 4 teaches, in order to solve this problem, using an ion implantation mask provided on the surface of an SiC substrate or a thin $SiO_2$ film having a thickness of 10 to 30 nm as a "protection film". However, Patent Document 4 fails to teach the aforementioned problem occurring in the case where an electrostatic chuck which is heated to a high temperature is used, or any solution thereto.

The present invention has been made in order to solve the above problems, and a main objective thereof is to, in a production method for a semiconductor device which performs a high-temperature ion implantation by using an electrostatic chuck, reduce occurrence of defects that are formed on an attracted face of a semiconductor wafer.

Means for Solving the Problems

A production method for a semiconductor device according to the present invention comprises the steps of: (a) forming a protection film on one face of a semiconductor wafer, the semiconductor wafer having a principal face and a rear face which is parallel to the principal face; (b) allowing the semiconductor wafer to be attracted onto an attracting face of an electrostatic chuck which is heated to 400° C. or more, the semiconductor wafer being attracted onto the attracting face via the protection film; (c) while heating the semiconductor wafer to 400° C. or more, performing an ion implantation for the face of the semiconductor wafer on which the protection film is not formed; and (d) removing the protection film from the semiconductor wafer.

In a preferred embodiment, the protection film is formed on the principal face of the semiconductor wafer, and the ion implantation is performed for the rear face of the semiconductor wafer.

In a preferred embodiment, the protection film has a hardness which is higher than a hardness of the attracting face of the electrostatic chuck. In this case, the protection film preferably has a thickness of no less than 80 nm and no more than 5 μm.

In a preferred embodiment, the protection film has a hardness which is lower than a hardness of the attracting face of the electrostatic chuck, and the protection film has a thickness of no less than 1 μm and no more than 5 μm.

In a preferred embodiment, step (b) comprises the steps of: (b1) placing the semiconductor wafer on the attracting face of the electrostatic chuck heated to 400° C. or more; and (b2) increasing a voltage applied to the electrostatic chuck in multiple steps. At step (b2), the increase in the voltage applied to the electrostatic chuck preferably occurs over a time of 0.5 seconds or more.

In a preferred embodiment, the protection film has a flat surface.

In a preferred embodiment, the semiconductor wafer is made of silicon carbide.

In a preferred embodiment, the attracting face of the electrostatic chuck is made of pyrolytic boron nitride.

In a preferred embodiment, the protection film is made of a material whose main component is silicon or carbon.

In a preferred embodiment, the protection film is a single layer or multilayer film which is made of at least one of silicon oxide and polycrystalline silicon.

A preferred embodiment comprises a step of performing, before step (a), an ion implantation for the face of the semiconductor wafer on which the protection film is formed.

A preferred embodiment comprises a step of performing, after step (d), an ion implantation for the face of the semiconductor wafer on which the protection film was formed.

Effects of the Invention

According to the present invention, even when a semiconductor wafer is attracted by using an electrostatic chuck which is heated to a high temperature of 400° C. or more, the presence of a protection film which is provided on the semiconductor wafer effectively reduces formation of defects on an attracted face of the semiconductor wafer.

Moreover, in the case where the surface of the electrostatic chuck is composed of a material having a lower hardness than that of the semiconductor wafer, even if the surface of the electrostatic chuck is abraded to form particles, these particles will adhere to the protection film. Thus, an effect is provided in that the particles will also be removed from the semiconductor wafer at the time of removing the protection film.

Figure 1:
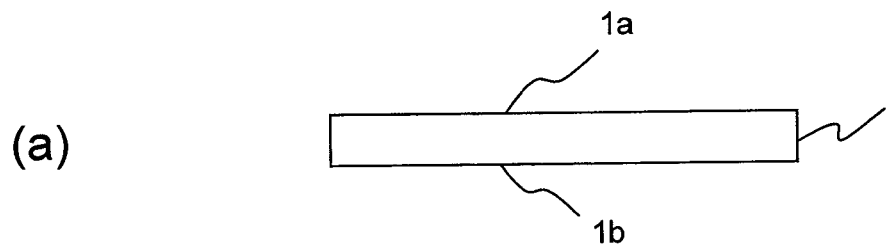
[FIG. 1](a) to (e) are cross-sectional structural diagrams showing a production method for a semiconductor device according to a first embodiment.
Figure 1:
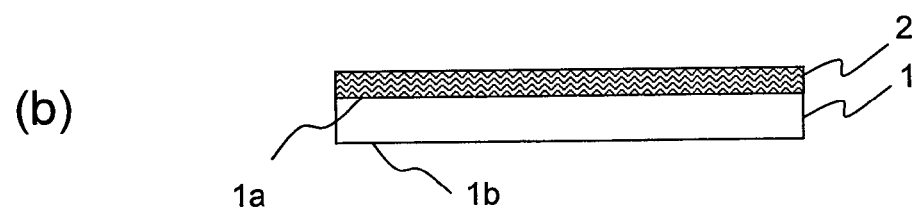
Figure 1:
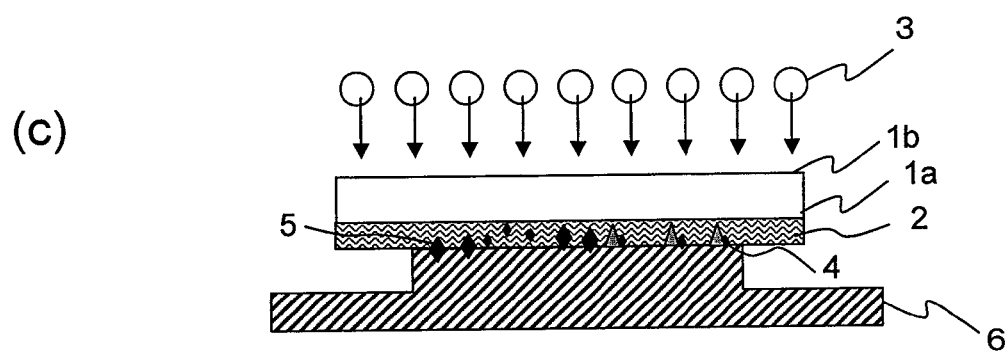
Figure 1:
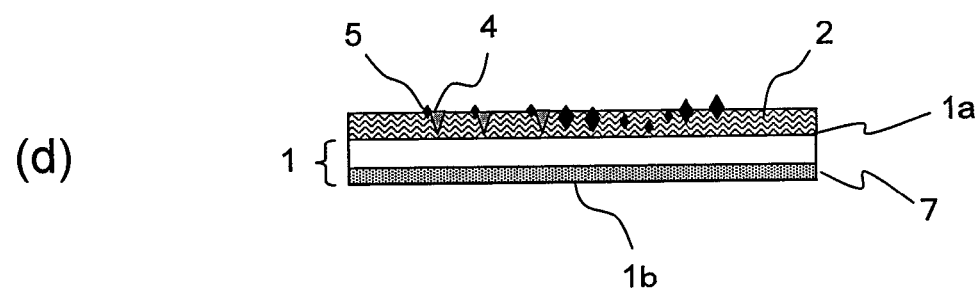
Figure 1:
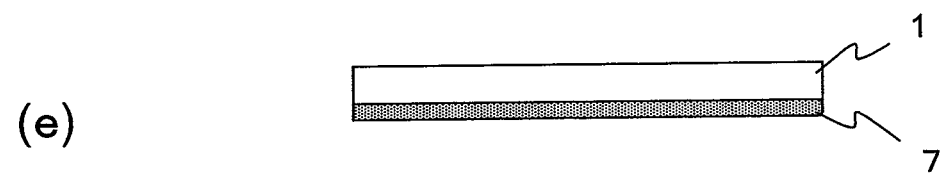

DESCRIPTION OF REFERENCE NUMERALS 1 semiconductor wafer
1a first face (principal face of semiconductor wafer)
1b second face (rear face of semiconductor wafer)
2 protection film
3 ion
4 scratch
5 particle
6 electrostatic chuck
6a protrusion on electrostatic chuck surface
7 rear face implantation layer
21 base
22 surface dielectric layer
23a first electrode
23b second electrode
24 power supply
101 silicon carbide substrate
102 drift layer
103 well region
104 contact region
105 source region
106 gate insulating film
107 drain electrode
108 source electrode
109 gate electrode
110 interlayer insulating film
111 upper wiring
112 implantation mask

BEST MODE FOR CARRYING OUT THE INVENTION

As described earlier, the cause for the deterioration of device characteristics when a semiconductor wafer is attracted (or clamped) by using an electrostatic chuck which is heated to a high temperature is defects such as scratches being formed on the attracted face of the semiconductor wafer which is attracted to the electrostatic chuck.

Therefore, before describing preferable embodiments of the present invention, the cause for scratches formed on the attracted face (or chucked surface) of a semiconductor wafer when an electrostatic chuck at a high temperature comes in contact with the semiconductor wafer will be described.

Figure 2:
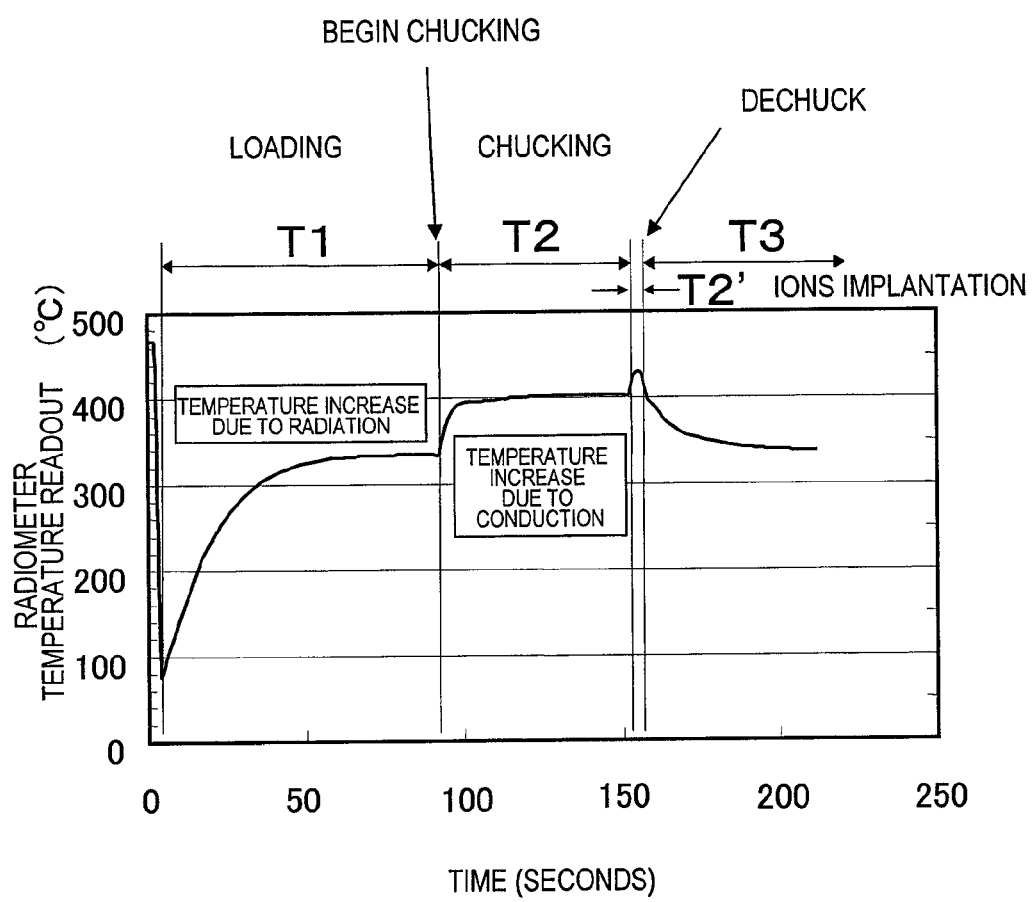
[FIG. 2] A time chart showing the change over time of the surface temperature of a wafer, as an attracted object of an electrostatic chuck having a heating mechanism.

FIG. 2 is a graph showing the change over time of the wafer surface temperature when an SiC wafer is attracted by an electrostatic chuck having a heating mechanism. The vertical axis of the graph represents the temperature of the wafer surface as measured by a radiation thermometer, whereas the horizontal axis represents time. The data of FIG. 2 is obtained by an experiment of actually chucking an SiC wafer with an electrostatic chuck whose attracting face is set to a temperature of 400° C.

When attracting a semiconductor wafer onto an electrostatic chuck, first, the semiconductor wafer is loaded onto a chuck face of the electrostatic chuck. Since the semiconductor wafer has some warp or the like, the semiconductor wafer and the electrostatic chuck are not in close contact at this time. After the temperature is saturated through a period T1 (e.g. 50 to 150 seconds) from the beginning of loading, a voltage is applied to the electrodes of the electrostatic chuck, whereby the semiconductor wafer is attracted by the electrostatic chuck (begin chucking).

In FIG. 2, it is only during a period T2 that the semiconductor wafer is in close contact with the surface (attracting face) of the electrostatic chuck. As can be seen from FIG. 2, in the period T1 after the semiconductor wafer is loaded and before it is actually attracted, the wafer surface temperature increases to about 330° C. and then is saturated. This heating of the semiconductor wafer mainly occurs through radiation from the surface of the electrostatic chuck (400° C.). Thereafter, when an electrostatic chucking is carried out, the semiconductor wafer comes in close contact with the attracting face of the electrostatic chuck. Therefore, as the period T2 begins, the wafer surface temperature drastically increases, until saturating at 400° C. (period T2). In the period T2, the heating of the semiconductor wafer occurs through direct heat conduction from the electrostatic chuck at a high temperature, until an ion implantation is carried out in a period T2'. In this example, the semiconductor wafer is disposed horizontally during any period other than the period T2' of radiating an ion beam, but is disposed vertically along with the entire electrostatic chuck for the sake of ion implantation during the period T2'. Therefore, in the period T2', the semiconductor wafer is displaced from the measurement position of the radiation thermometer, so that the temperature in the period T2' appears to be increased; however, this is not the actual temperature of the semiconductor wafer.

After the lapse of the period T2, dechucking is carried out, whereby the semiconductor wafer is detached from the attracting face of the electrostatic chuck, and thus the wafer surface temperature gradually decreases to the initial level of about 330° C. (period T3).

The semiconductor wafer undergoes a thermal expansion also while the wafer surface temperature is increasing due to radiation from the electrostatic chuck (period T1), but, since the electrostatic chuck and the semiconductor wafer are not in close contact, no significant formation of scratches and the like occurs on the surface of the semiconductor wafer. Thereafter, when a chuck voltage is applied to the electrodes of the electrostatic chuck, the semiconductor wafer is firmly pressed against the electrostatic chuck due to an electrostatic force. When the semiconductor wafer is pressed against the electrostatic chuck and both come in close contact, the wafer temperature drastically increases as shown in FIG. 2, so that the thermal expansion also progresses drastically. In other words, while being pressed against the electrostatic chuck by an electrostatic force which acts in the thickness direction thereof, the semiconductor wafer undergoes a drastic thermal expansion in an in-plane direction. At this time, the attracted face of the semiconductor wafer and the attracting face of the electrostatic chuck rub against each other with a strong force.

Figure 11:
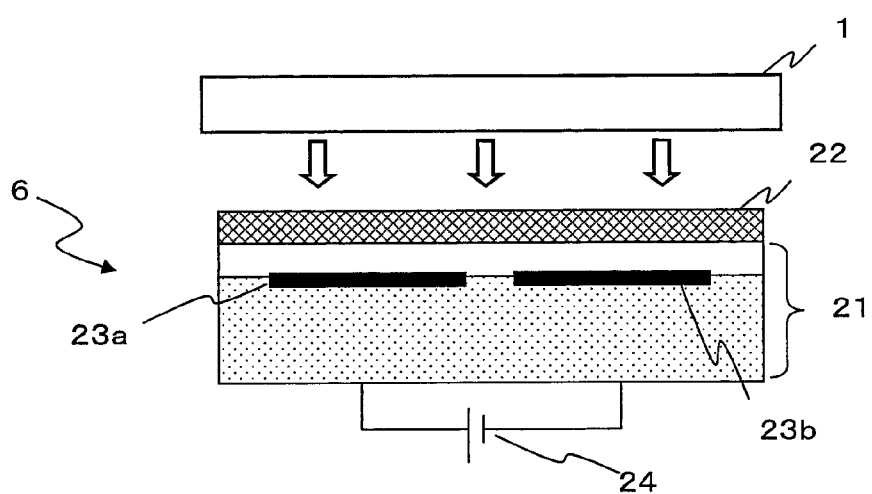
[FIG. 11] A cross-sectional view showing the structure of an electrostatic chuck.
Figure 12:
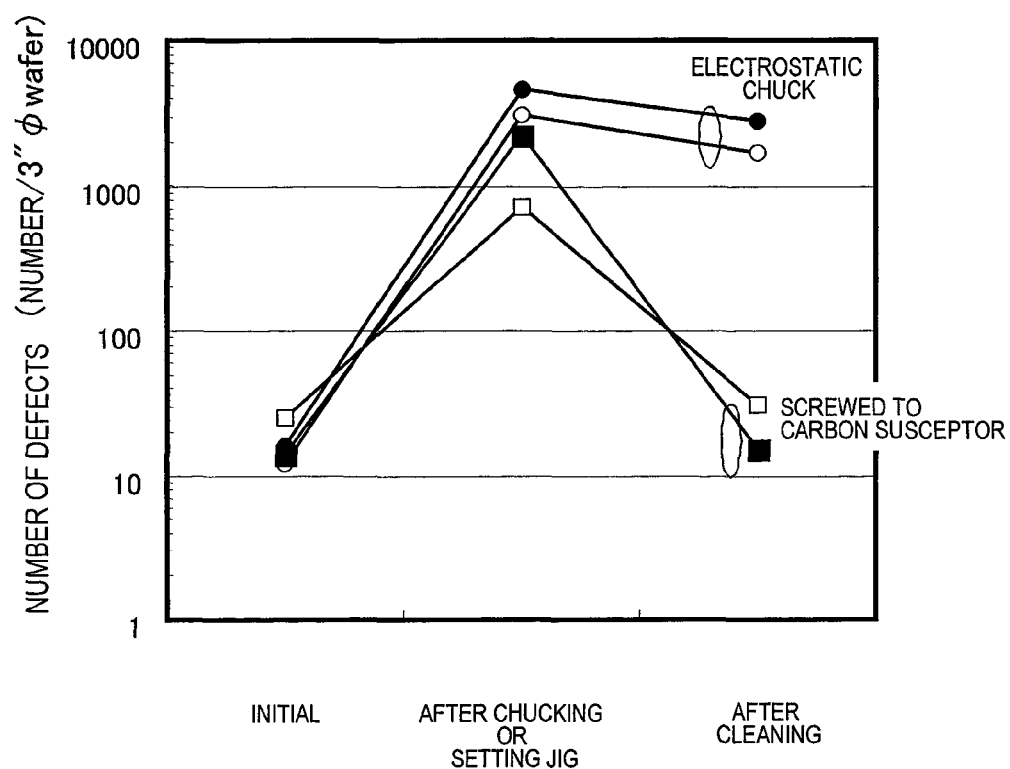
[FIG. 12] A graph showing the number of defects on a wafer attracted face in the case where either a conventional susceptor having an internal heater or an electrostatic chuck is used.

Electrostatic chucks which are currently broadly used have an attracting face (the surface dielectric layer 22 in FIG. 11) which is made of aluminum nitride (AlN), whose hardness is lower than the hardness of silicon carbide. Moreover, the attracting face of an electrostatic chuck is planarized as much as possible, in order not to give scratches to the attracted face of a semiconductor wafer. Therefore, it is not expectable that the electrostatic chuck will form scratches on a wafer which is made of a hard semiconductor such as silicon carbide, and there has been no report of scratches actually being observed. However, according to detailed studies by the inventors, minute bumps and foreign objects locally exist on the AlN surface of an electrostatic chuck even if it has been subjected to a planarization treatment, and, if the aforementioned thermal expansion occurs drastically during a high-temperature chucking, these bumps and foreign objects will form defects in portions of the semiconductor wafer.

Herein, defects refer to the following three types.
(1) "Scratches", which are made when the attracted face of a semiconductor wafer is abraded by the protrusions and foreign objects that exist on the attracting face of an electrostatic chuck.
(2) "Particles", which are the wafer material having been abraded by the protrusions and foreign objects that exist on the attracting face of an electrostatic chuck and attracted onto the attracting face of a semiconductor wafer.
(3) "Particles", which are the material of the attracting face of an electrostatic chuck that having been abraded by a semiconductor wafer and adhered to the attracted face of a semiconductor wafer.

These defects directly affect the device structure, and cause deteriorations in performance and a lowered yield. Moreover, AlN, which is broadly used as an insulator material on the electrostatic chuck surface, and pyrolytic boron nitride (pBN) contain nitrogen (N), aluminum (Al), and boron (B), which are used as dopants (impurities) for silicon carbide semiconductor. Therefore, if an activation annealing is performed while these particles remain on the wafer, there is a possibility that the concentration of the diffusion layer that is meant to be formed may change, or its conductivity type may be reversed. In particular, boron (B) is an exceptional element which is capable of diffusing within silicon carbide, and usually presents a large problem for a silicon carbide power device that is fabricated by using an n type substrate.

The inventors have found that occurrence of scratches and particles on a semiconductor wafer can be effectively suppressed by forming a protection film on the attracting face side of the semiconductor wafer before attracting the semiconductor wafer with an electrostatic chuck at a high temperature, then performing an ion implantation, and thereafter removing the protection film from the semiconductor wafer, thereby accomplishing the present invention. Hereinafter, preferred embodiments of the present invention will be described.

First Embodiment

First, a first embodiment of a production method for a semiconductor device according to the present invention will be described. In the present embodiment, an Si wafer is used as a semiconductor wafer.

With reference to FIG. 1, a production method for a semiconductor device according to the present embodiment will be described. FIGS. 1(*a*) to (*e*) are cross-sectional views showing a flow of steps of the present embodiment.

First, as shown in FIG. 1(*a*), a plurality of semiconductor wafers 1 each having a first face (principal face) 1*a* and a second face (rear face) 1*b* were provided. Each of the semiconductor wafers 1 used herein was an n type Si wafer having a diameter of 3 inches, with a specific resistance of 10 to 20 Ω·cm. Thereafter, as shown in FIG. 1(b), a protection film 2 was formed on the first face 1a of the semiconductor wafer 1. Specifically, four semiconductor wafers 1 having four types of different protection films 2 deposited on the first face 1a thereof, as well as a semiconductor wafer 1 (Comparative Example) having no protection film deposited thereon, were provided.

On the four semiconductor wafers 1, protection films 2 having the following constructions were respectively deposited.

(A) $SiO_2$ (thickness 100 nm)
(B) $SiO_2$ (thickness 1000 nm)
(C) poly-Si (thickness 800 nm)/thermal oxide film (thickness 70 nm)
(D) $SiO_2$ (thickness 1000 nm)/poly-Si (thickness 800 nm)/thermal oxide film (thickness 70 nm)

In the film constructions of (C) and (D) above, the left item is on the surface side, and the right item is on the wafer side.

The protection film 2 needs to endure a temperature (400° C. or more) at which an ion implantation is performed for the semiconductor wafer 1. Therefore, the protection film 2 needs to be made of a material whose melting point or sublimation point is higher than the wafer surface temperature in the ion implantation step. Furthermore, it is preferable that the protection film 2 does not contain any metal which would constitute a contamination to the semiconductor, and that an element composing the semiconductor wafer 1 is a main component of the protection film 2. From these standpoints, preferable materials of the protection film 2 are $SiO_2$ and poly-Si.

The aforementioned $SiO_2$ was deposited by plasma CVD. Silane ($SiH_4$) and $N_2O$ were used as source gases. The thermal oxide film was formed by heating the semiconductor wafer 1 to a temperature of about 1000° C. in a quartz tube, and maintaining it for about 1 hour while flowing about 1 SLM of dry oxygen in the quartz tube. The poly-Si was deposited by a thermal CVD using $SiH_4$ as a source gas.

Before performing an ion implantation, the number of defects on the first face 1a of the semiconductor wafer 1 was evaluated by using a defect checking apparatus.

Next, as shown in FIG. 1(c), after the first face 1a of the semiconductor wafer 1 was attracted onto the electrostatic chuck 6 via the protection film 2, ions 3 were implanted to the second face 1b. The attracting face of the electrostatic chuck 6 in the present embodiment was formed of AlN, and was heated by a heating mechanism not shown. In the present embodiment, the temperature of the attracting face was set to 460° C. The surface temperature of the semiconductor wafer 1 was measured by a radiation thermometer not shown. The ion implantation was begun after confirming that the surface temperature of the semiconductor wafer 1 had increased to 460° C. Boron (B) was used as the ions 3, the implantation energy was set to 100 keV, and the dose was set to about $5 \times 10^{14}$ $cm^{-2}$. The wafer had a tilt angle of 7° and an orientation flat angle of 23°. Thus, a rear face implantation layer 7 (see FIG. 1(d)) was formed on the second face 1b side of the semiconductor wafer 1.

Since the attracting face had been heated to a temperature of 400° C. or more, after the semiconductor wafer 1 came in contact with the attracting face of the electrostatic chuck 6, as shown in FIG. 1(c), scratches 4 were formed in the protection film 2, or particles 5 were formed between the protection film 2 and the attracting face of the electrostatic chuck 6.

Note that, in order to achieve attraction of the semiconductor wafer 1 with the electrostatic chuck 6, first, a step of placing the semiconductor wafer 1 on the attracting face of the electrostatic chuck 6 heated so that the temperature of the attracting face is 400° C. or more, and then a step of gradually increasing the voltage applied to the electrostatic chuck 6 are performed. As the voltage applied to the electrostatic chuck 6 increases, the semiconductor wafer 1 is more strongly attracted to the attracting face of the electrostatic chuck 6, thus realizing a higher degree of contact. If a high voltage is suddenly applied to the electrostatic chuck 6 in this state, the temperature of the semiconductor wafer 1 which is in close contact with the attracting face of the electrostatic chuck 6 rapidly increases, so that cracking or chipping may occur in the semiconductor wafer 1 due to thermal shock. In order to avoid such problems, it is preferable that the voltage applied to the electrostatic chuck 6 is gradually increased. Specifically, it is desirable that the applied voltage is increased in multiple steps (ramped up). The time during which to increase the applied voltage from zero volts to the final level is preferably set to 0.5 seconds or more, and more preferably set to 1 second or more. This also applies to the other embodiments described below.

After performing the ion implantation step, with the semiconductor wafer 1 being detached from the electrostatic chuck 6 as shown in FIG. 1(d), the number of defects on the surface of the protection film 2 of the semiconductor wafer 1 was evaluated. In the sample lacking the protection film 2, defects on the first face 1a of the semiconductor wafer 1 were evaluated.

After removing the protection film 2 from the semiconductor wafer 1 as shown in FIG. 1(e), a cleaning with a sulfuric peroxide mixture and a cleaning with an ammonia-and-hydrogen peroxide mixture were performed. For removal of $SiO_2$, the semiconductor wafer 1 was immersed in a 10:1 buffered hydrofluoric acid (BHF) for 30 minutes. For removal of poly-Si, the semiconductor wafer 1 was immersed in hydrofluoric/nitric acid for about 10 minutes. As the sulfuric peroxide mixture, a mixed solution of sulfuric acid:hydrogen peroxide:water=1:1:5 was used, and it was carried out for e.g. 10 minutes while maintaining the liquid temperature at 130° C. As the ammonia-and-hydrogen peroxide mixture, a mixed solution of ammonia water:hydrogen peroxide:water=1:1:8 was used, and it was carried out for e.g. 10 minutes while maintaining the liquid temperature at 120° C. The wafer after cleaning was subjected to a cleaning under running water and then spin-dried, and the number of defects was evaluated.

Figure 3:
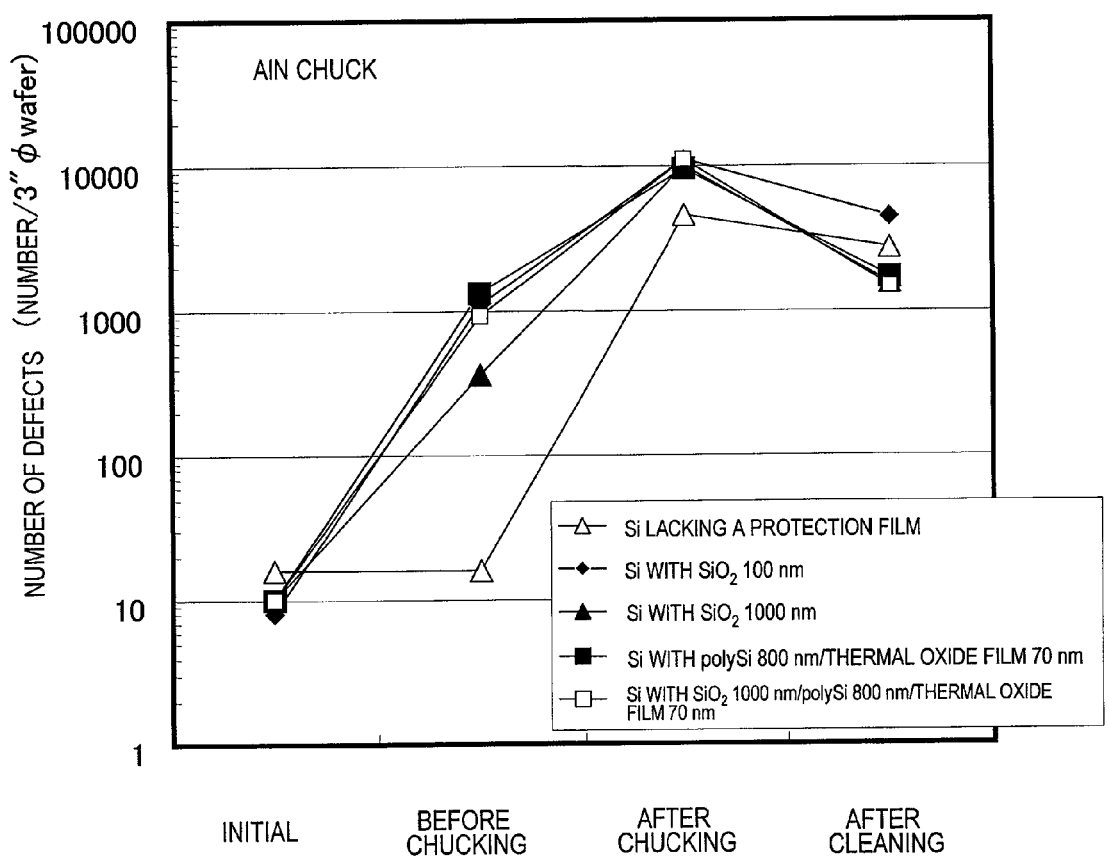
[FIG. 3] A graph showing the number of defects on a wafer attracting face in a production method for a semiconductor device according to the first embodiment.

Evaluated results of the number of defects, at the respective phases of initial, before chucking, after chucking, and after cleaning, are shown in FIG. 3. Herein, "initial" means a state before the protection film is formed, whereas "before chucking" means a state immediately after the protection film is formed. Moreover, "after chucking" means a state where the semiconductor wafer has been detached from the electrostatic chuck after chucking with an electrostatic chuck is performed. This is also true of FIG. 6 described later.

As can be seen from FIG. 3, in the semiconductor wafers having a protection film formed thereon, the number of defects "before chucking" is increased from the "initial" number of defects. The presumable reason is that dust and the like adhered to the semiconductor wafer through the process of forming a protection film by using a thin film deposition apparatus. Therefore, the defects that constitute the number of defects "before chucking" are different defects from the aforementioned three types of defects, that is, the "defects" that occur due to the electrostatic chuck.

In the Si wafer lacking a protection film (Comparative Example), the number of defects was hardly reduced even after cleaning. In every semiconductor wafer 1 having the protection film 2 formed thereon, a decrease by one digit to a half digit was observed in the number of defects after cleaning as compared to that after implantation. Thus, a high cleaning effect was obtained.

A comparison of only the number of defects after cleaning, which affects the subsequent steps, indicated that the number of defects of any semiconductor wafer 1 having the protection film 2 formed thereon was lower than the number of defects of the Comparative Example, except for the semiconductor wafer 1 having the aforementioned protection film (A) ($SiO_2$: thickness 100 nm) formed thereon.

The attracting face of the Si wafer lacking a protection film, after ion implantation, was observed by using a scanning electron microscope with EDAX. There were scratches on the wafer attracting face, and particles had adhered near the scratches. With an EDAX element analysis, the particles were confirmed to be silicon from the wafer material.

Figure 4:
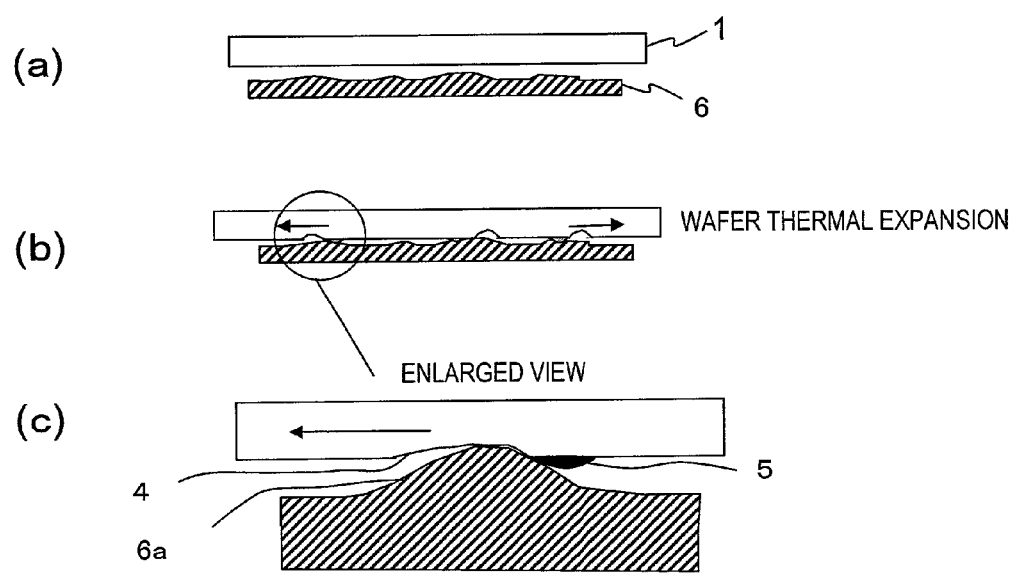
[FIG. 4](a) to (c) are cross-sectional views showing a model in which defects occur on a wafer attracting face.

FIGS. 4(a) to (c) are cross-sectional views for a modeled illustration of a phenomenon where scratches occur on the attracting face of the semiconductor wafer 1 when the electrostatic chuck 6 attracts the semiconductor wafer 1.

FIG. 4(a) shows the surfaces of the semiconductor wafer 1 and the electrostatic chuck 6 before electrostatic chucking. Although the surface of the electrostatic chuck 6 has been planarized by grinding or polishing, bumps and dents actually exist on this surface. FIG. 4(b) is a diagram showing a relationship between the semiconductor wafer 1 and the electrostatic chuck 6 after electrostatic chucking. Through electrostatic chucking, the semiconductor wafer 1 undergoes a drastic thermal expansion along the lateral direction while being pressed against the surface of the electrostatic chuck 6. At this time, as shown in FIG. 4(c), protrusions 6a present on the surface of the electrostatic chuck 6 gouge the surface of the semiconductor wafer 1 to form the scratches 4, and the wafer material having been abraded off is left as burrs at the ends of the scratches 4. These burrs become the particles 5. In other words, the scratches 4 and the particles 5 are formed in pairs.

In this model, the depth of the scratches 4 should basically be equal to the height of the protrusions 6a on the surface of the electrostatic chuck 6. Therefore, if a protection film 2 which is thicker than the height of the protrusions 6a on the surface of the electrostatic chuck 6 is formed on the attracting face of the semiconductor wafer 1, the scratches 4 will not reach the wafer surface but remain in the protection film 2. If the protection film 2 is removed after the ion implantation step, the scratches 4 formed in the protection film 2 and the particles 5 when the protection film 2 is abraded can also be removed from the wafer surface (lift-off).

However, in the case where the thickness of the protection film 2 is smaller than the height of the protrusions 6a, there is a possibility that the scratches 4 may penetrate through the protection film 2 and reach the wafer surface, and, even if the protection film 2 is removed after the ion implantation step, scratches 4 may be left on the wafer surface. In other words, if the protection film 2 is too thin, the number of defects after cleaning cannot be sufficiently reduced as compared to a wafer lacking a protection film.

From the above, it is preferable that the protection film 2 is thick. However, if it is too thick, the distance between the attracted face of the semiconductor wafer 1 and the attracting face of the electrostatic chuck 6 will become large, thus resulting in a low electrostatic attraction power. According to a study by the inventors, the preferable thickness of the protection film 2 is no less than 1 μm and no more than 5 μm, and its more preferable range is no less than 1.5 μm and no more than 4 μm.

Figure 5:
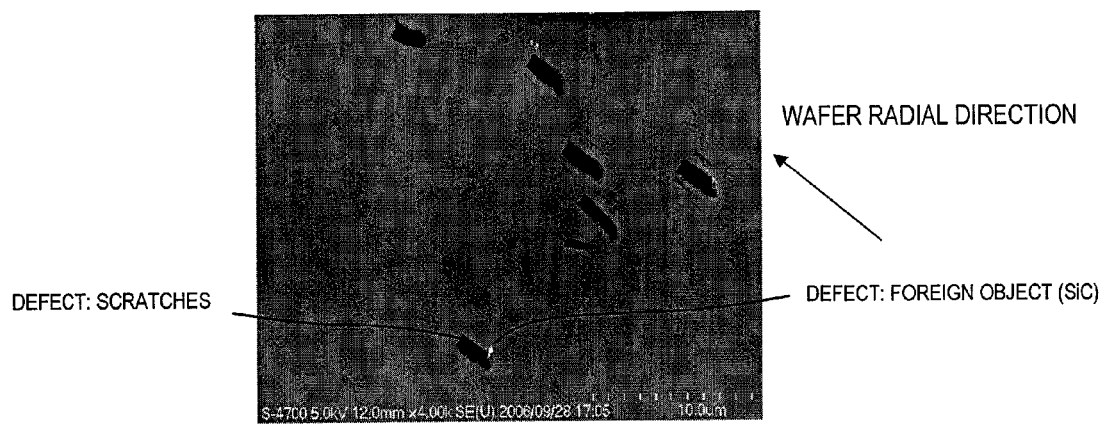
[FIG. 5] A diagram showing a result of SEM observation of defects occurring on an SiC wafer attracting face.

Scratches caused by protrusions on the attracting face were also observed in semiconductor wafers other than Si wafers. FIG. 5 is a scanning electron microscope (SEM) photograph showing the attracted face of an SiC wafer after attracting a silicon carbide (SiC) semiconductor wafer with an electrostatic chuck whose surface is made of AlN. Scratches (defect) were observed which were aligned lengthwise along a wafer radial direction. It was also found that foreign objects of SiC had adhered to the ends of the scratches.

The presumable reason why the direction of the scratches is aligned along a wafer radial direction is that an SiC wafer thermally expands in a radial manner from the wafer center. The hardness of SiC is slightly higher than the hardness of AlN, and as mentioned earlier, it is unexpected that an electrostatic chuck with an AlN surface will leave any scratches on an SiC wafer. However, scratches were in fact formed as shown in FIG. 5.

Note that the material of the protection film 2 is not limited to $SiO_2$ or poly-Si, but may be silicon nitrides, graphites whose main component is carbon, or diamond. The construction of the protection film 2 does not need to be a single layer, but may be a structure in which different types of layers are stacked. The semiconductor wafer is not limited to silicon or silicon carbide, but may be a compound semiconductor such as gallium arsenide, indium phosphide, or gallium nitride.

Second Embodiment

Hereinafter, a second embodiment of a production method for a semiconductor device according to the present invention will be described. In the present embodiment, the attracting face of the electrostatic chuck is made of pyrolytic boron nitride (pBN). pBN is a material with a layered structure, and is a material whose hardness is significantly lower than that of AlN.

The temperature of the attracting face of the electrostatic chuck was set to 460° C., similarly to the first embodiment. In the present embodiment, the following seven different types of semiconductor wafers were provided.

(E) an Si wafer lacking a protection film
(F) an Si wafer with $SiO_2$ (thickness 1 μm)
(G) an SiC wafer lacking a protection film
(H) an SiC wafer with $SiO_2$ (thickness 1 μm)
(I) an Si wafer with $SiO_2$ ((thickness 0.1 μm)
(J) an SiC wafer with $SiO_2$ ((thickness 0.1 μm)
(K) an SiC wafer with poly-Si (thickness 800 nm)/thermal oxide film (thickness 70 nm)

Each Si wafer has the same specifications as those used in the first embodiment. Each SiC wafer is a 4H—SiC wafer having a diameter of 3 inches, n-conductivity type, and a specific resistance of 0.02 Ω·cm, and is an "off-cut substrate" such that its principal face is 8 degrees off in the <11-20> direction from the (0001) plane. The first face 1a is the (0001) plane, whereas the second face 1b is the (000-1) plane.

In the present embodiment, as in the first embodiment, the production steps shown in FIG. 1 were performed, and the defects on the wafer attracted face were evaluated. The details of each step are similar to those in the first embodiment, and their descriptions are not repeated herein.

Figure 6:
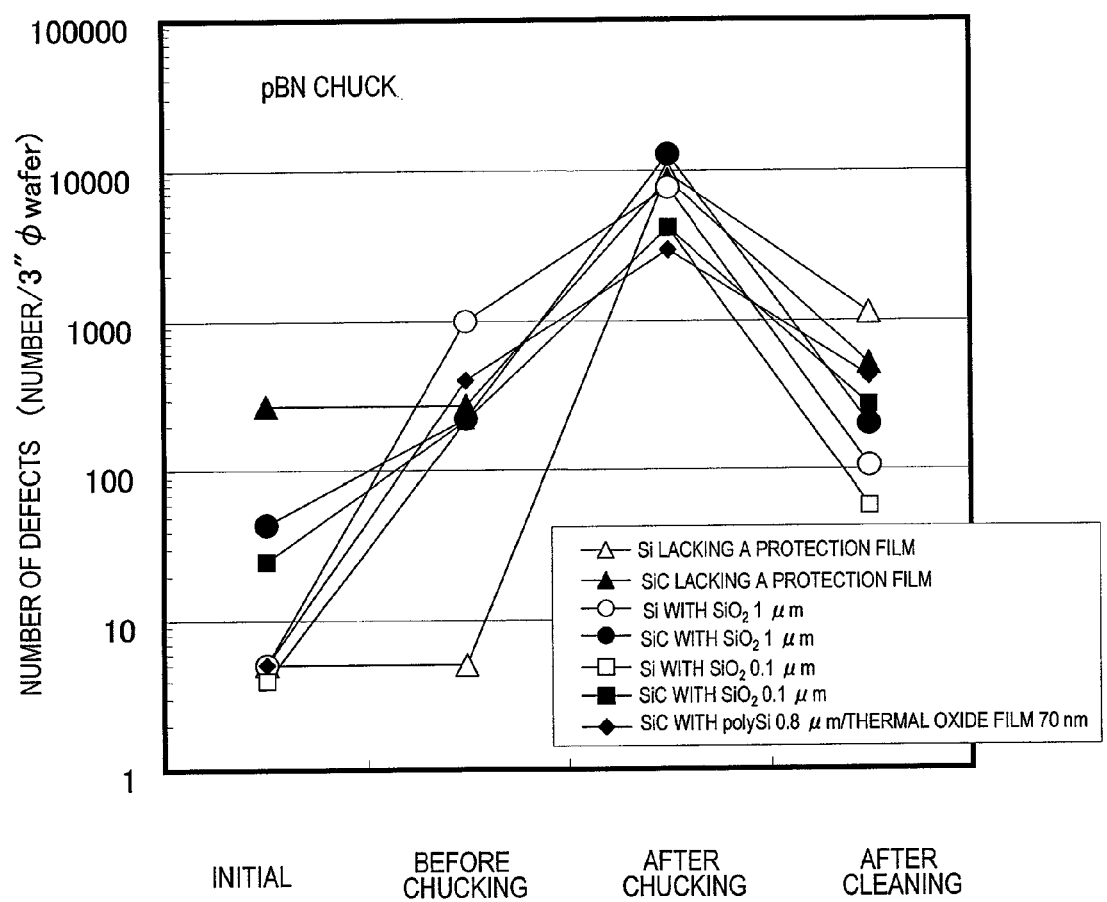
[FIG. 6] A graph showing the number of defects on a wafer attracting face in a production method for a semiconductor device according to a second embodiment.

Evaluated results of the number of defects, at the respective phases of initial, before chucking, after chucking, and after cleaning, are shown in FIG. 6. As can be seen from FIG. 6, regardless of whether an Si wafer or an SiC wafer, the number of defects after cleaning was one digit smaller in wafers which were subjected to a high-temperature ion implantation with a protection film formed thereon and from which the protection film was later removed, than those of the wafers lacking a protection film.

Moreover, as can be seen from a comparison between FIG. 3 and FIG. 6, the number of defects after cleaning is reduced by one digit in the case where the surface material of the electrostatic chuck is pBN than in the case where it is AlN. This is regardless of whether the protection film 2 exists or not. From this, it can be seen that pBN is more preferable than AlN as the material of the attracting face of the electrostatic chuck.

Moreover, in the case where the surface material of the electrostatic chuck was AlN, hardly any reduction in the defects after cleaning was attained by a thin protection film having a thickness of 100 nm (=0.1 μm). It was found on the other hand that, in the case of using an electrostatic chuck whose attracting face was made of soft pBN, a thin protection film with a thickness of 0.1 μm attained similar effects to those attained by a protection film with a thickness of 1 μm.

Thus, in an electrostatic chuck whose attracting face is made of pBN, the thickness of the protection film can be relatively reduced. In the case of forming the protection film through thermal oxidation of the semiconductor wafer surface, since the rate of thermal oxidation of silicon carbide is low, a thick protection film would present a problem in that a long time is required for forming the protection film, thus resulting in a low mass producibility. Therefore, as in the present embodiment, it is preferable to use an electrostatic chuck whose attracting face is made of a material having a lower hardness than that of the semiconductor wafer, and make the thickness of the protection film relatively thin. According to a study by the inventors, in the case of using an electrostatic chuck whose attracting face is made of pBN, it suffices if the thickness of the protection film is 80 nm or more, and the upper limit of its thickness may be set to 5 μm.

Also in the present embodiment, with respect to an Si wafer and an SiC wafer lacking a protection film, the surface on the attracted face side thereof was observed by using an SEM with EDAX immediately after high-temperature ion implantation. However, no scratches like those formed in the protection film were observed, but only particles were observed. These particles were subjected to an EDAX element analysis, which indicated their main element to be boron. Presumably, the pBN at the electrostatic chuck surface having been abraded off through friction with the wafer became particles, and were attracted onto the wafer.

SEM observation results of the first and second embodiments are shown in Table 1.

TABLE 1

| material of attracting face of electrostatic chuck | wafer material | |
| --- | --- | --- |
| | silicon | silicon carbide |
| aluminum nitride (AlN) | scratches silicon particles | scratches silicon carbide particles |
| boron nitride (pBN) | pBN particles | pBN particles |

It was found that, regardless of whether the wafer material to be attracted was silicon or silicon carbide, AlN having a relatively high hardness gave scratches to the wafer attracting face. Conversely, regardless of whether the wafer material was silicon or silicon carbide, pBN having a relatively low hardness did not give any scratches to the wafer attracting face, and pBN particles were formed. While particles on the wafer surface can be removed by cleaning, scratches formed on the wafer surface cannot be removed. Therefore, it is preferable that the surface material of the electrostatic chuck is made of a material having a low hardness (e.g. pBN).

In the case where a protection film is deposited on the semiconductor wafer, the particles which have adhered to the surface of the protection film and the particles which have been entrenched in the protection film can be removed together with the protection film. Requirements for the protection film are as follows.

Requirement 1) Being able to endure the wafer surface temperature at the step of processing the wafer (processing temperature).

Requirement 2) Being a material which does not contaminate the wafer.

Requirement 3) Not being abraded through rubbing against an electrostatic chuck surface at the time of electrostatic chucking.

From Requirement 1), the material of the protection film needs to be a material having a melting point or sublimation point which is at least higher than the wafer surface treatment temperature during the processing step. From Requirement 2), metals are not preferable, and if possible, a material which is mainly composed of an element composing the wafer material is preferable. From Requirement 3), the hardness of the protection film is preferably higher than the hardness of the material of the electrostatic chuck surface.

From the above, in the present embodiment, too, the protection film is preferably silicon oxide ($SiO_2$), polycrystalline silicon (polySi), silicon nitride film (SiN), or the like, and may be graphite, diamond-like carbon, or the like.

Note that the semiconductor wafer in the present embodiment is also not limited to silicon or silicon carbide, but may be a compound semiconductor such as gallium arsenide, indium phosphide, or gallium nitride.

Third Embodiment

Hereinafter, a third embodiment of a production method for a semiconductor device according to the present invention will be described. In the present embodiment, a vertical MISFET of silicon carbide semiconductor is produced.

Figure 7:
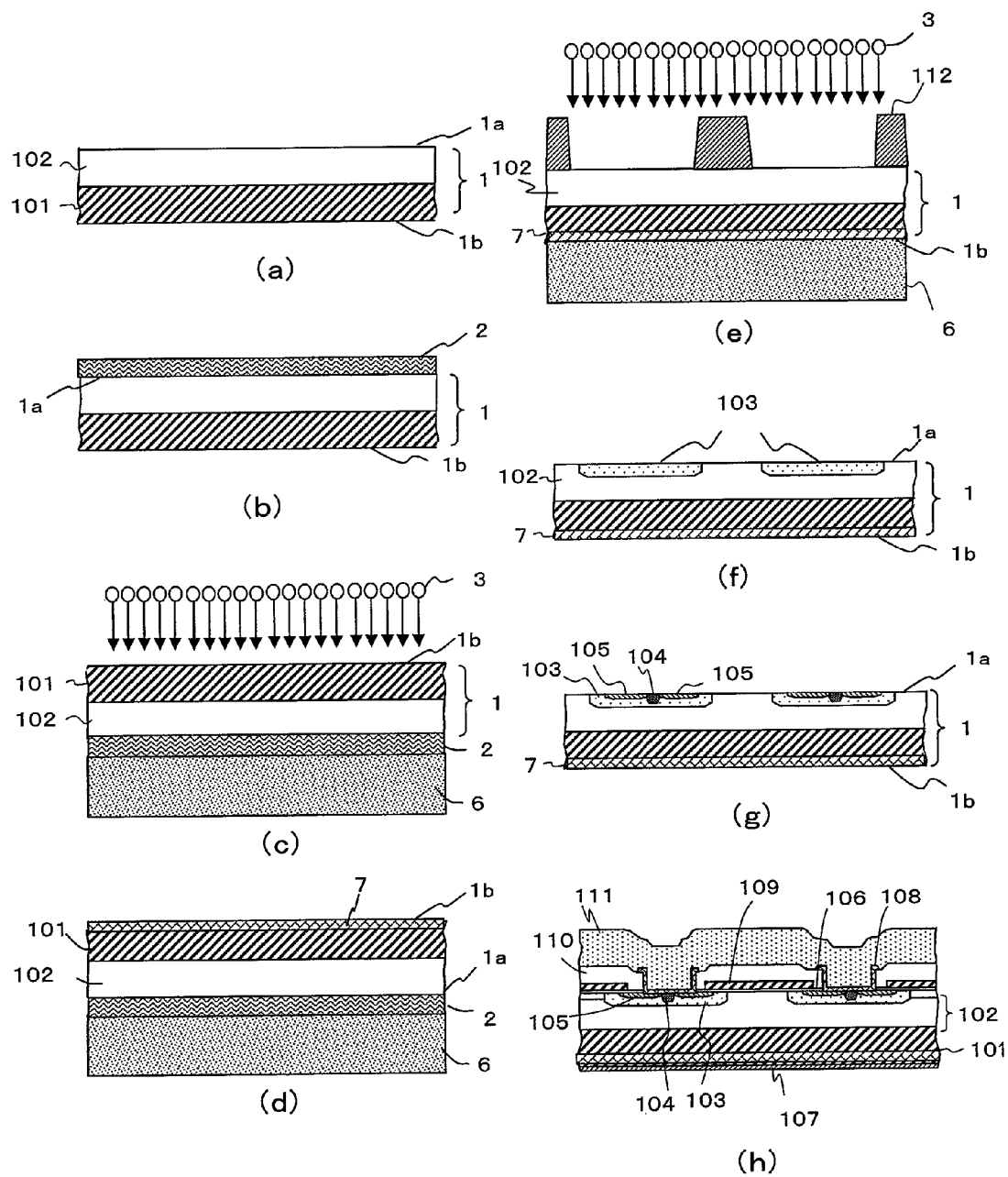
[FIG. 7](a) to (h) are cross-sectional structural diagrams showing a production method for a silicon carbide vertical MISFET semiconductor device according to a third embodiment.

First, FIG. 7 is referred to. FIGS. 7(a) to (h) are step-by-step cross-sectional views showing production steps of a vertical MISFET of silicon carbide semiconductor according to the present embodiment.

In the present embodiment, the chuck surface of the electrostatic chuck 6 is made of pBN, and the setting temperature of the electrostatic chuck 6 is 460° C.

First, as shown in FIG. 7(a), a semiconductor wafer 1 is provided in which a drift layer 102 of silicon carbide is epitaxially grown on a silicon carbide substrate 101. In the present specification, in the case where a semiconductor layer is formed on the surface of the semiconductor substrate, the entire body will be referred to as the "semiconductor wafer". A first face 1a of the semiconductor wafer 1 ("principal face" of the wafer) is an upper face of the drift layer 102, whereas a second face 1b ("rear face" of the wafer) is a lower face of the silicon carbide substrate 101.

The silicon carbide substrate 101 has a principal face which is 8° off in the <11-20> direction from the (0001) plane, with an n type doping concentration of $1 \times 10^{18}$ $cm^{-3}$ to $5 \times 10^{19}$ $cm^{-3}$.

The drift layer 102 having a lower doping concentration than that of the silicon carbide substrate 101 can be obtained by performing a thermal CVD which employs e.g. silane (SiH$_4$) and propane (C$_3$H$_8$) as source gases, hydrogen (H$_2$) as a carrier gas, and nitrogen (N$_2$) gas as a dopant gas. In the case of producing an MOSFET having a breakdown voltage of 600 V, it is preferable that the doping concentration of the drift layer 102 is adjusted to 1×10$^{15}$ cm$^{-3}$ to 1×10$^{16}$ cm$^{-3}$, and that the thickness is set to 10 μm or more.

Next, as shown in FIG. 7(b), a protection film 2 is formed on the first face 1a of the semiconductor wafer 1. As the protection film 2, SiO$_2$ can be deposited to a thickness of 1 μm by CVD technique, for example.

Thereafter, as shown in FIG. 7(c), the first face 1a of the semiconductor wafer 1 is attracted onto the electrostatic chuck 6, and an ion implantation is performed for the second face 1b. The temperature of the electrostatic chuck is set to 460° C., for example. As ions 3, a dopant which exhibits the same n type as does the silicon carbide substrate 101 is used, e.g. nitrogen. Through this ion implantation, a rear face implantation layer 7 can be formed on the surface of the second face 1b of the semiconductor wafer 1 (FIG. 7(d)). The rear face implantation layer 7 is to be formed in order to reduce the contact resistance of a drain electrode; an implantation layer with a higher concentration than that of the silicon carbide substrate 101 is to be formed. Note that an activation annealing does not need to be performed at this point.

After the ion implantation step at a high temperature is finished, the semiconductor wafer 1 is detached from the electrostatic chuck, and is taken out to the exterior of the ion implantation apparatus, and then a next step is executed. In the subsequent steps, a p well and an n type source region will be formed on the first face 1a of the semiconductor wafer 1, thus forming a channel. Moreover, a gate insulating film and a gate electrode are to be formed on the first face 1a side. Therefore, the channel mobility will be lowered if particles from the electrostatic chuck adhere to or scratches are formed on the first face 1a during the implantation step for the second face 1b. Moreover, contamination of the first face 1a will cause a deterioration in the breakdown voltage and a deterioration in the reliability of the gate insulating film. However, in the present embodiment, it is possible to enhance the device characteristics because the protection film 2 is formed on the face (first face 1a) of the semiconductor wafer 1 on which the channel and the gate insulating film are to be formed, thereby preventing occurrence of defects in and contamination of the first face 1a.

In order to remove the particles occurring from the electrostatic chuck 6, the protection film 2 is removed by wet etching, and thereafter the semiconductor wafer 1 is subjected to a cleaning with a sulfuric peroxide mixture and a cleaning with an ammonia-and-hydrogen peroxide mixture. In the case of using SiO$_2$ as the protection film 2, for example, the protection film 2 can be removed by being immersed in a 10:1 buffered hydrofluoric acid for 30 minutes. The details of the cleaning with a sulfuric peroxide mixture and the cleaning with an ammonia-and-hydrogen peroxide mixture are as have been described with reference to the first embodiment.

Next, as shown in FIG. 7(e), p type well regions 103 (see FIG. 7(f)) are formed on the surface of the drift layer 102 by an ion implantation technique. Also at this time, the semiconductor wafer 1 is attracted with the electrostatic chuck 6, which has been heated to a high temperature within an ion implantation apparatus, and the ion implantation is performed in this state. However, it is the second face 1b of the semiconductor wafer 1 that comes in close contact with the attracting face of the electrostatic chuck 6. No protection film is formed on the second face 1b.

As an implantation mask 112 shown in FIG. 7(e), a patterned SiO$_2$ film (thickness: 2 μm) can be used. The ions 3 to be implanted herein are Al, which is a p type dopant. In this ion implantation step, too, the setting temperature of the semiconductor wafer 1 is 460° C.

The second face 1b which is now chucked will only have a drain electrode added thereto in a subsequent step, and therefore is not so susceptible to defects and contamination as the first face 1a. Therefore, in this step, it is unnecessary to provide a protection film on the second face 1b to be attracted to the electrostatic chuck 6. However, a protection film may be formed on the second face 1b.

After the ion implantation is completed, the implantation mask 112 is removed as shown in FIG. 7(f). In the case where the implantation mask 112 is made of SiO$_2$, the implantation mask 112 can be removed by being immersed in a 10:1 buffered hydrofluoric acid for 30 minutes, for example. Thus, through the above ion implantation, the p type well regions 103 are formed on the surface of the first face 1a.

Similarly, by performing an Al ion implantation and a nitrogen ion implantation by using patterned implantation masks (not shown), contact regions 104 and source regions 105 as shown in FIG. 7(g) are formed.

Thereafter, a single instance of activation annealing at 1700° C. and for 30 minutes, for example, is performed in an inert gas ambient. Then, in order to form a gate insulating film 106 shown in FIG. 7(h), a thermal oxide film is grown, for example. By maintaining it at 1100° C. for 3 hours while flowing 3 SLM of dry oxygen, for example, a thermal oxide film having a thickness of about 70 nm can be formed.

Next, gate electrodes 109 are formed above desired regions of the gate insulating film 106. As the material of the gate electrode 109, polycrystalline silicon to which conductivity has been conferred is preferably used. Such a polycrystalline silicon film can be formed by a thermal CVD using silane as a source gas and phosphine PH$_3$ as a doping gas. The patterning can be carried out through usual photolithography and dry etching. After the gate electrode 109 is formed, an interlayer insulating film 110 made of SiO$_2$ is deposited. After forming contact holes by making openings in predetermined regions of the interlayer insulating film 110 via dry etching, source electrodes 108 are formed in the contact holes. The source electrodes 108 can be formed by forming e.g. titanium or nickel to a thickness of e.g. 50 nm, and thereafter sintering it at a temperature of about 950° C. for about 1 minute.

A drain electrode 107 is formed on the rear face implantation layer 7, which has been formed on the second face 1b. The drain electrode 107 is obtained by forming e.g. titanium or nickel to a thickness of e.g. 50 nm, and thereafter sintering it at a temperature of about 950° C. for about 1 minute.

An upper wiring 111 is formed on the surface of the interlayer insulating film 110. The upper wiring 111 is obtained by depositing aluminum to a thickness of 3 μm, for example, and patterning the aluminum by a usual photolithography and a dry etching or wet etching. Thus, the silicon carbide vertical MISFET is completed (FIG. 7(h)).

In the silicon carbide vertical MISFET which is obtained by the above-described production method, in an ion implantation step for the second face 1b (substrate rear face), the first face 1a on which a channel is formed is attracted to an electrostatic chuck via the protection film 2, so that the particles which exist on the surface of the protection film 2 after ion implantation and the scratches which have been formed on the protection film 2 are removed together with the protection film 2. As a result, formation of defects on the first face 1a can be suppressed, whereby a deterioration in the channel mobility, a deterioration in the breakdown voltage of the gate insulating film, and a deterioration in the reliability can be prevented.

Although the present embodiment illustrates an MISFET as an example of a vertical power device, the present invention is not limited thereto. The present invention is applicable to any vertical power device in which a current flows from a first face (principal face) of the wafer to a second face (rear face) opposite therefrom, e.g., an IGBT, a JFET, a static induction transistor (SIT), a PN diode, or a Schottky diode.

Fourth Embodiment

With reference to FIGS. 8(a) to (h), another embodiment of a production method for a semiconductor device according to the present invention will be described.

In the present embodiment, an ion implantation is first performed for a first face 1a of the semiconductor wafer 1 ("principal face" of the wafer) to form well regions, contact regions, and source regions, and thereafter an ion implantation is performed for a second face 1b ("rear face" of the wafer). In the present embodiment, while performing an ion implantation for the first face 1a, there is no protection film formed on the second face 1b. When an ion implantation is performed for the first face 1a of the semiconductor wafer 1 without a protection film, defects may be formed on the second face 1b. However, the rear face implantation layer 7 has not been formed at this point, but the rear face implantation layer 7 is to be formed by subsequently performing an ion implantation for the second face 1b. Therefore, no defects due to electrostatic chucking will occur in the rear face implantation layer 7.

Figure 8:
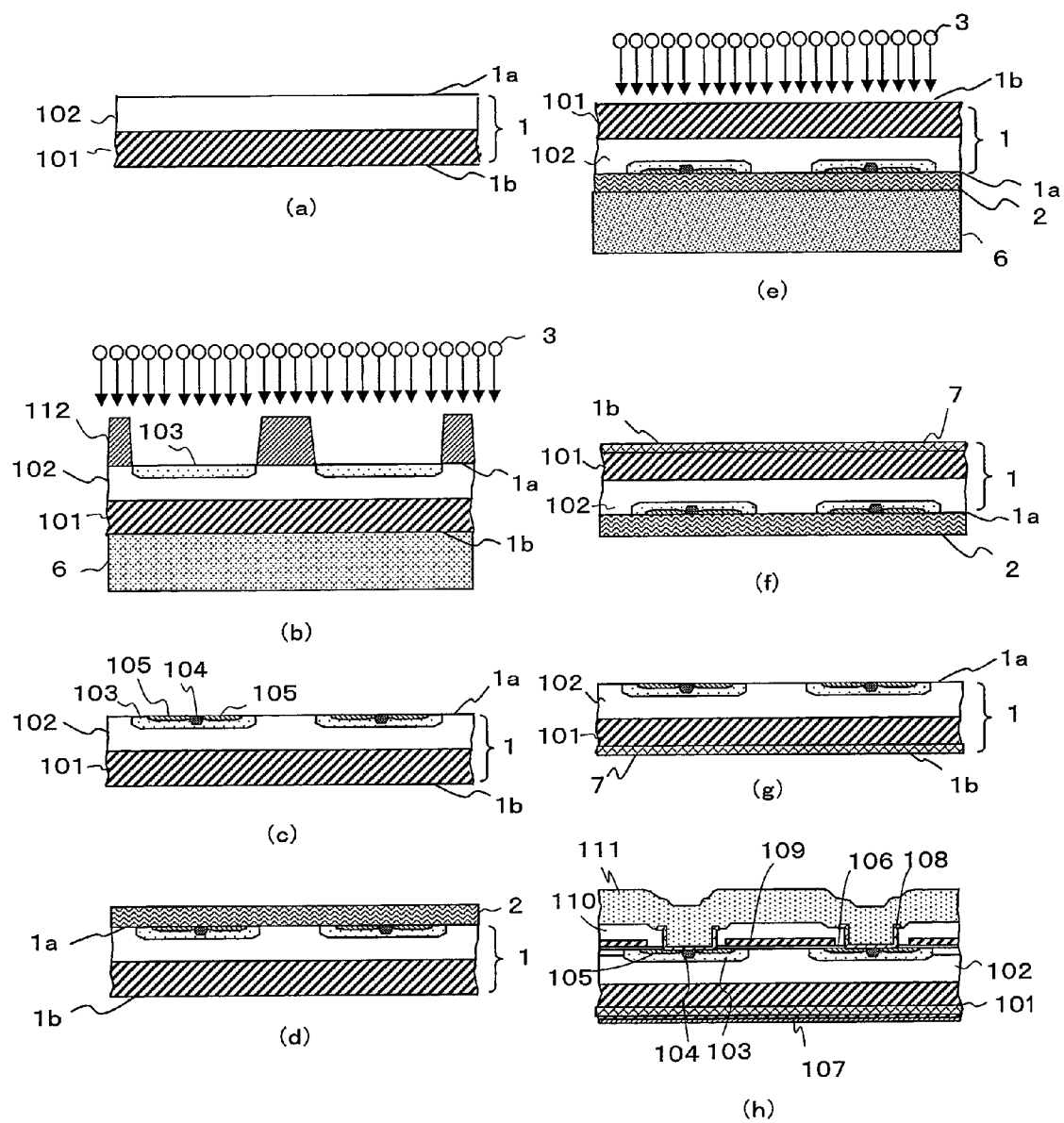
[FIG. 8](a) to (h) are cross-sectional structural diagrams showing a production method for a silicon carbide vertical MISFET semiconductor device according to a fourth embodiment.

First, FIG. 8(a) will be referred to.

In the present embodiment, too, a semiconductor wafer 1 similar to the semiconductor wafer 1 described with reference to the first embodiment is provided.

Next, as shown in FIG. 8(b), p type well regions 103 are formed on the surface of a drift layer 102 by an ion implantation technique. As the implantation mask 112, $SiO_2$ is used in a patterned form, with a thickness of e.g. 2 μm. As the ions, Al is implanted, which is a p type dopant. In this step, too, the implantation temperature is 460° C. The second face 1b to be chucked will only have a drain electrode added thereto in a subsequent step, and therefore is not so susceptible to defects and contamination as the first face 1a on which a channel and a gate insulating film are to be formed. Therefore, in this step, no protection film needs to be formed on the second face 1b to be attracted onto an electrostatic chuck 6. However, it will be appreciated that a protection film may be formed.

After the ion implantation is completed, the implantation mask 112 is removed. In the case of $SiO_2$, it can be removed by being immersed in a 10:1 buffered hydrofluoric acid for 30 minutes, for example. In this manner, the p type well regions 103 are formed on the surface of the first face 1a.

Similarly, an Al ion implantation and a nitrogen ion implantation are performed through patterned implantation masks not shown, thus forming contact regions 104 and source regions 105 (FIG. 8(c)). Since a single instance of activation annealing will be performed later, no activation annealing needs to be performed at this point.

Next, as shown in FIG. 8(d), a protection film 2 is formed on the first face 1a of the semiconductor wafer 1. As the protection film, $SiO_2$ is deposited to a thickness 1 μm by CVD technique, for example.

Thereafter, the first face 1a of the semiconductor wafer 1 is attracted to the electrostatic chuck 6, and a rear face ion implantation is performed for the second face 1b (FIG. 8(e)). The setting temperature of the electrostatic chuck 6 is 460° C., for example. As the ions 3, a dopant which exhibits the same n type as does the silicon carbide substrate 101 is used, e.g.

nitrogen. In this manner, the rear face implantation layer 7 is formed on the surface of the second face 1b of the semiconductor wafer (FIG. 8(f)). The rear face implantation layer 7 is to be formed in order to reduce the contact resistance of a drain electrode; an implantation layer with a higher concentration than that of the silicon carbide substrate 101 is to be formed. Note that an activation annealing does not need to be performed at this point.

Next, in order to remove the particles occurring from the electrostatic chuck 6, as shown in FIG. 8(g), the protection film 2 is removed by wet etching, and thereafter the semiconductor wafer 1 is subjected to a cleaning with a sulfuric peroxide mixture and a cleaning with an ammonia-and-hydrogen peroxide mixture. In the case of using $SiO_2$ as the protection film, for example, it can be removed by being immersed in a 10:1 buffered hydrofluoric acid for 30 minutes. The details of the cleaning with a sulfuric peroxide mixture and the cleaning with an ammonia-and-hydrogen peroxide mixture are the same as in the first embodiment.

Thereafter, a single instance of activation annealing at 1700° C. and for 30 minutes, for example, is performed in an inert gas ambient. Then, the silicon carbide vertical MISFET shown in FIG. 8(h) is produced by the step which has been described with reference to the third embodiment referring to FIG. 7(h).

In the silicon carbide vertical MISFET which is produced by the production method according to the present embodiment, in an ion implantation step for the second face 1b (substrate rear face), the first face 1a on which a channel is formed is attracted to the electrostatic chuck 6 via the protection film 2, so that the particles which exist on the surface of the protection film 2 after ion implantation and the scratches which have been formed on the protection film 2 are removed together with the protection film 2. As a result, formation of defects on the first face 1a can be suppressed, whereby a deterioration in the channel mobility, a deterioration in the breakdown voltage of the gate insulating film, and a deterioration in the reliability can be prevented.

Although the present embodiment illustrates an MISFET as an example of a vertical power device, the present invention is not limited thereto. The present invention is applicable to any vertical power device in which a current flows from a first face of the wafer to a second face opposite therefrom, e.g., an IGBT, a JFET, a static induction transistor (SIT), a PN diode, or a Schottky diode.

In the third and fourth embodiments described above, high-temperature ion implantations are respectively performed for the first face 1a and the second face 1b of the semiconductor wafer 1, but in different orders. This aspect will be discussed with reference to FIGS. 9(a) and (b).

Figure 9:
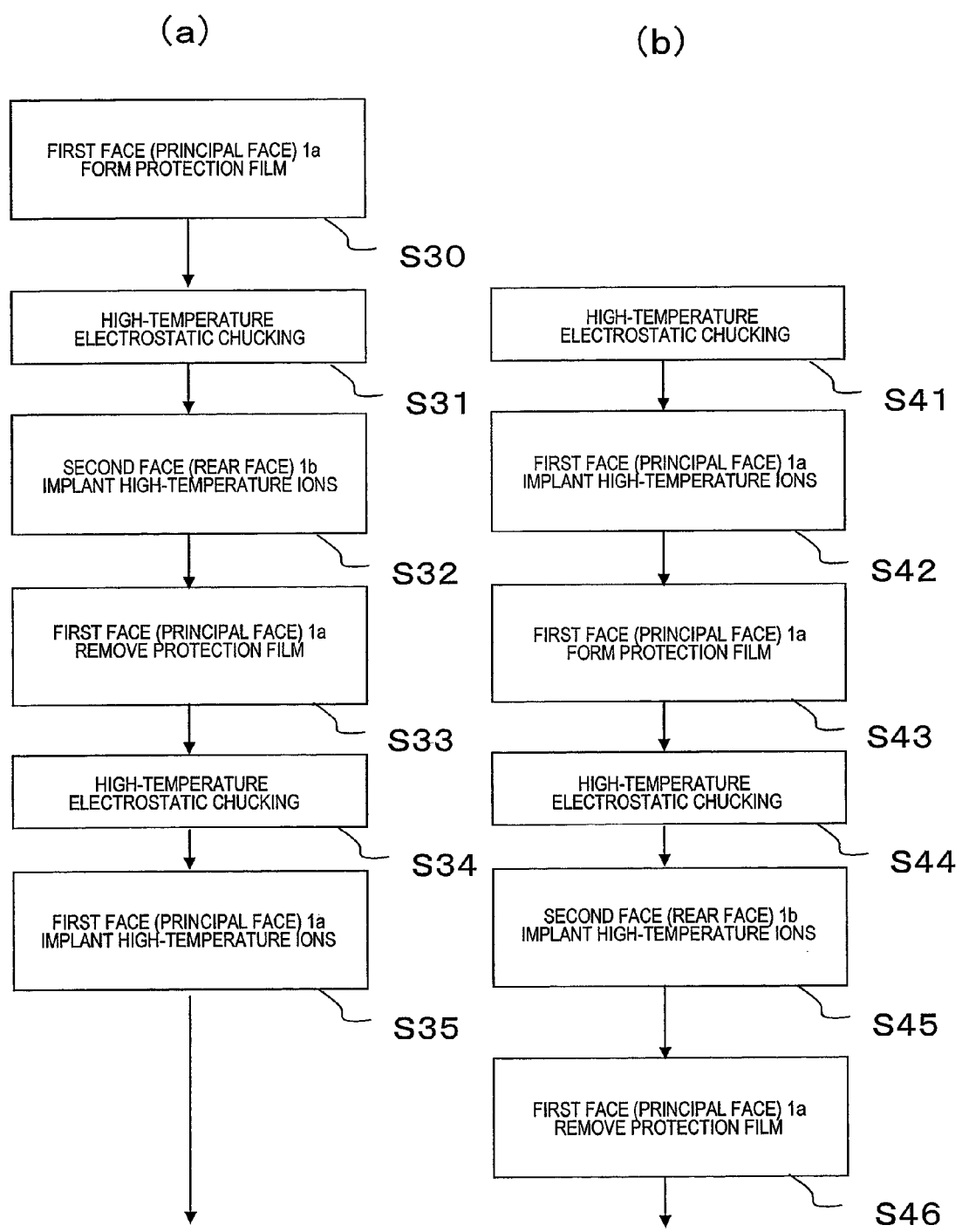
[FIGS. 9](a) and (b) are flowcharts showing main steps in the third embodiment and the fourth embodiment, respectively.
Figure 10:
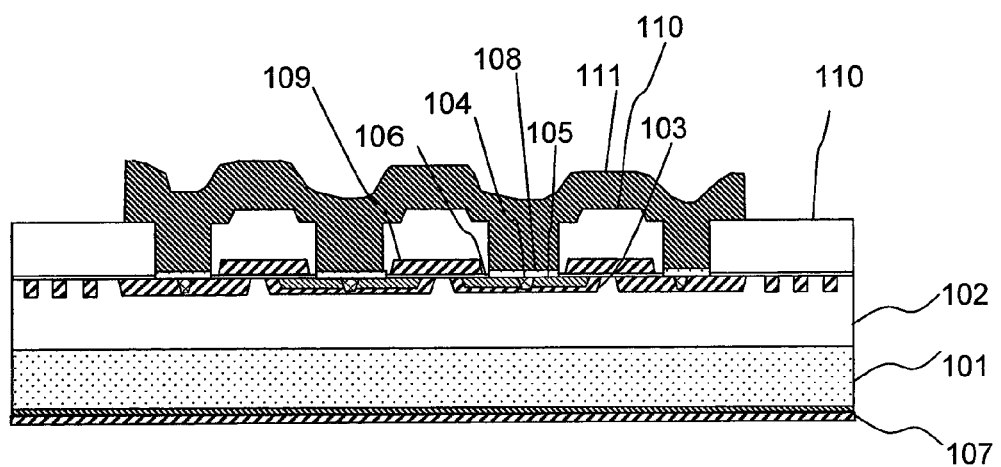
[FIG. 10] A cross-sectional structural diagram of a commonly-used silicon carbide vertical MISFET.

FIG. 9(a) is a flowchart showing the main steps in the third embodiment, whereas FIG. 9(b) is a flowchart showing the main steps in the fourth embodiment.

In the third embodiment, after forming a protection film on the first face 1a of the semiconductor wafer 1 at step S30, a high-temperature electrostatic chucking is performed at step S31, and a high-temperature ion implantation for the second face 1b is perform at step S32. After removing the protection film at step S33, a high-temperature electrostatic chucking is performed at step S34, and a high-temperature ion implantation for the first face 1a is performed at step S35.

On the other hand, in the fourth embodiment, a high-temperature electrostatic chucking is performed at step S41, and a high-temperature ion implantation for the first face 1a of the semiconductor wafer 1 is perform at step S42. After forming a protection film on the first face 1a at step S43, a high-temperature electrostatic chucking is performed at step S44, and a high-temperature ion implantation for the second face 1b is performed at step S45. Thereafter, the protection film is removed at step S46.

Either case is characterized in that, when performing a high-temperature ion implantation for the second face (rear face) 1b of the semiconductor wafer, the first face (principal face) 1a to be attracted to an electrostatic chuck is protected with a protection film. When performing a high-temperature ion implantation for the first face 1a, the second face 1b to be attracted to the electrostatic chuck is not protected by any protection film, but the resultant scratches will not greatly affect the device characteristics. However, if particles do occur, it is preferable to form a protection film also on the second face 1b to facilitate removal of the particles from the semiconductor wafer.

Note that, according to the present invention, the presence of a protection film also provides an effect of avoiding a direct contact between any metal that is present on the attracting face of an electrostatic chuck and the surface of a semiconductor wafer, thereby preventing generation of reaction products. However, in order to obtain this effect alone, it will suffice if the thickness of the protection film is 30 nm as described in Patent Document 4. In the present invention, however, a protection film with a sufficient thickness is formed on the semiconductor wafer in order to solve problems due to friction occurring between a high-temperature attracting face of the electrostatic chuck and the semiconductor wafer. It has been believed that no thick insulating layer should be provided between an attracting face and a semiconductor wafer because the electrostatic force will be lowered according to the operation principles of an electrostatic chuck. However, the inventors have dared to introduce a protection film, thus successfully enhancing the throughput of an ion implantation performed by using an electrostatic chuck at a high temperature to a mass production level, and placing this into practical use.

When considering the action of the protection film according to the present invention, it is preferable that the protection film is flat. The reason is that, in the case where the attracting face of an electrostatic chuck is made of a material having a relatively low hardness, problems may occur if bumps and dents are present on the protection film, e.g., scratches being formed or particles occurring on the attracting face. Herein, a protection film being "flat" means that the protection film is not patterned by a lithography technique or the like, such that the protection film has a uniform thickness.

INDUSTRIAL APPLICABILITY

The present invention makes it possible, in a production method for a semiconductor device using an electrostatic chuck, to effectively reduce the defects which are formed on an attracted face of a semiconductor wafer with respect to the electrostatic chuck. Therefore, the yield of a semiconductor device can be improved, thus providing a high industrial applicability.

The invention claimed is:

1. A production method for a semiconductor device, comprising the steps of:

(a) forming a protection film on one face of a semiconductor wafer, the semiconductor wafer having a principal face and a rear face which is parallel to the principal face;

(b) allowing the semiconductor wafer to be attracted onto an attracting face of an electrostatic chuck which is heated to 400° C. or more, the semiconductor wafer being attracted onto the attracting face via the protection film;

(c) while heating the semiconductor wafer to 400° C. or more, performing an ion implantation for the face of the semiconductor wafer on which the protection film is not formed;

(d) removing the protection film from the semiconductor wafer; wherein, step (b) comprises the steps of placing the semiconductor wafer on the attracting face of the electrostatic chuck heated to 400° C. or more and increasing a temperature of the semiconductor wafer to a first temperature, and applying a voltage to the electrostatic chuck and allowing the semiconductor wafer to be attracted onto the attracting face, thereby increasing the temperature of the semiconductor wafer further from the first temperature to reach 400° C. or more; and the protection film has a hardness which is lower than a hardness of the attracting face of the electrostatic chuck, and the protection film has a thickness of no less than 1 μm and no more than 5 μm.

2. The production method for a semiconductor device of claim 1, wherein the protection film is formed on the principal face of the semiconductor wafer, and the ion implantation is performed for the rear face of the semiconductor wafer.

3. The production method for a semiconductor device of claim 1, wherein step (b) comprises:
a step of increasing a voltage applied to the electrostatic chuck in multiple steps.

4. The production method for a semiconductor device of claim 3, wherein, at the step of increasing a voltage applied to the electrostatic chuck in multiple steps, the increase in the voltage applied to the electrostatic chuck occurs over a time of 0.5 seconds or more.

5. The production method for a semiconductor device of claim 1, wherein the protection film has a flat surface.

6. The production method for a semiconductor device of claim 1, wherein the semiconductor wafer is made of silicon carbide.

7. The production method for a semiconductor device of claim 1, wherein the protection film is made of a material whose main component is silicon or carbon.

8. The production method for a semiconductor device of claim 7, wherein the protection film is a single layer or multilayer film which is made of at least one of silicon oxide and polycrystalline silicon.

9. The production method for a semiconductor device of claim 1, comprising a step of performing, before step (a), an ion implantation for the face of the semiconductor wafer on which the protection film is formed.

10. The production method for a semiconductor device of claim 1, comprising a step of performing, after step (d), an ion implantation for the face of the semiconductor wafer on which the protection film was formed.

* * * * *